United States Patent
Guenther

(10) Patent No.: US 10,837,983 B2
(45) Date of Patent: Nov. 17, 2020

(54) OSCILLOSCOPE AS WELL AS METHOD FOR ANALYZING A MEASURED SIGNAL

(71) Applicant: Rohde & Schwarz GmbH & Co. KG, Munich (DE)

(72) Inventor: Mario Guenther, Glauchau (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 441 days.

(21) Appl. No.: 15/691,513

(22) Filed: Aug. 30, 2017

(65) Prior Publication Data

US 2019/0064224 A1 Feb. 28, 2019

(51) Int. Cl.
*G01R 13/02* (2006.01)

(52) U.S. Cl.
CPC ....... *G01R 13/029* (2013.01); *G01R 13/0254* (2013.01)

(58) Field of Classification Search
CPC .......................... G01R 13/0254; G01R 13/029
See application file for complete search history.

(56) References Cited

U.S. PATENT DOCUMENTS

| | | | |
|---|---|---|---|
| 5,003,248 A | 3/1991 | Johnson | |
| 5,155,431 A * | 10/1992 | Holcomb | G01R 13/345 324/115 |
| 6,111,400 A * | 8/2000 | Foster | G01R 13/345 324/121 R |
| 6,570,592 B1 * | 5/2003 | Sajdak | G01R 13/02 345/440.1 |
| 2007/0282542 A1 * | 12/2007 | Duff | G01R 13/0254 702/35 |
| 2008/0270054 A1 * | 10/2008 | Freidhof | G01R 13/32 702/67 |
| 2011/0060541 A1 * | 3/2011 | Bartlett | G01R 13/0254 702/67 |
| 2014/0297287 A1 * | 10/2014 | Newman | G10L 15/22 704/275 |
| 2015/0247885 A1 * | 9/2015 | Freidhof | G01R 1/06766 324/755.01 |
| 2015/0301086 A1 * | 10/2015 | Schaefer | G01R 13/0263 324/76.13 |
| 2017/0060114 A1 * | 3/2017 | Barford | G05B 19/045 |

FOREIGN PATENT DOCUMENTS

EP 1340987 A2 3/2003

* cited by examiner

*Primary Examiner* — Stephanie E Bloss
(74) *Attorney, Agent, or Firm* — Schwabe, Williamson & Wyatt, P.C.

(57) ABSTRACT

An oscilloscope has a measurement channel comprising an analog-to-digital converter providing digitized measurement input signal values, a triggering unit, an acquisition memory, and a digital voltmeter connected to said analog-to-digital converter. The digital voltmeter is configured for receiving untriggered values, determining a characteristic value of said untriggered values in a predefined interval, determining an output value based on said characteristic value, and storing said output value in an output memory of the oscilloscope. Further, a method for analyzing a measured signal using an oscilloscope is provided.

18 Claims, 2 Drawing Sheets ed Disclosure

OSCILLOSCOPE AS WELL AS METHOD FOR ANALYZING A MEASURED SIGNAL

FIELD OF THE DISCLOSURE

Embodiments of the present disclosure relate generally to an oscilloscope having at least one measurement channel and a method for analyzing a measured signal using an oscilloscope.

BACKGROUND

Oscilloscopes having a triggering unit for triggering data acquisition are known. The data acquisition is initiated by the triggering unit as soon as a trigger condition is met. The trigger condition is set by the user of the oscilloscope, and it is usually a threshold value that has to be reached or passed by the signals of the respective measurement channel.

If the trigger condition is not met by the signal, the data acquisition is not started and no data is displayed. To avoid these situations, it is known to introduce a trigger time-out being a time interval. If the trigger condition has not been met until the end of the trigger time-out, triggering is aborted or an auto-trigger, i.e. an automatic adaption of the trigger condition, is executed. This operation mode is called "auto-trigger mode". If no trigger time-out is set, the operation mode is called "norm-trigger mode".

However, because of the automated action at the end of the trigger time-out in auto-trigger mode, the user loses control of the measurement. In norm-trigger mode, the user has to search for a suitable trigger condition without information about the signal currently incoming at the measurement channel.

SUMMARY

Thus, there is a need for indicating the signal currently incoming at the measurement channel without automatically executing changes in the measurements by the oscilloscope, at least if the trigger condition is not met for a specific duration.

To address this need, among others, the present disclosure provides an oscilloscope having at least one measurement channel, said measurement channel comprising:

an analog-to-digital converter for converting an analog measurement input signal to digitized measurement input signal values, a triggering unit having a trigger condition, an acquisition memory for storing said digitized measurement input signal values if said trigger condition is met, and a digital voltmeter connected to said analog-to-digital converter.

The digital voltmeter is suited for receiving said digitized measurement input signal values as untriggered values, determining a characteristic value of said untriggered values in a predefined interval, determining an output value based on said characteristic value, and storing said output value in an output memory of said oscilloscope.

The triggering unit has received the trigger condition from the user and applies the trigger condition to the digitized measurement input signal values to check whether or not the trigger condition is met.

For example, the trigger condition is a threshold value, and in order for the trigger condition to be met, the signal incoming at the respective measurement channel has to reach or pass this threshold.

The digital voltmeter may be configured to perform the receiving, determining and storing steps at least if the trigger condition is not met.

The values fed to the digital voltmeter are not taken from the acquisition memory and have therefore not been subjected to a trigger (previously). Hence, the name "untriggered values".

Further, the disclosure provides a method for analyzing a measured signal using an oscilloscope with the following steps:

a) converting said measured signal into digitized measurement input signal values by an analog-to-digital converter, b) determining if at least one of said digitized measurement input signal values meets a trigger condition by a triggering unit of said oscilloscope, c) if said trigger condition is met, storing said digitized measurement input signal values in an acquisition memory, d) providing said digitized measurement input signal values to a digital voltmeter of said oscilloscope as untriggered values, e) determining at least one characteristic value of said untriggered values in a predefined interval, f) determining an output value based on said at least one characteristic value, and g) storing said output values in an output memory of said oscilloscope.

By determining a characteristic value of the signal that is applied to the respective measurement channel, it is possible to indicate properties of the incoming signal to the user so that the user can adjust the trigger condition accordingly. The user receives information on the reason why the trigger condition has not been met and is able to react to the situation himself, thus staying in full control of the measurement. No change of the trigger condition is performed automatically by the oscilloscope, in particular the digital voltmeter.

For example, said characteristic value is at least one of the peak-to-peak value, the root mean square, and the mean value of said untriggered values within said interval allowing for the determination of significant information to aid the user.

The length of said interval lies between 50 ms and 150 ms in order to allow the determination of the characteristic values close to real-time. The interval is 100 ms, for example.

In an embodiment of the disclosure, said digital voltmeter is adapted to determine said characteristic value by determining the minimum value and the maximum value of said untriggered values in said interval, determining a differential value as at least part of said characteristic value, said differential value being the difference between said maximum value and said minimum value. This allows a simple and efficient way to determine the peak-to-peak value.

In another aspect of the disclosure, said oscilloscope comprises a processing unit for determining a graphical representation of at least one output value stored in said output memory and for storing said graphical representation in a display memory of said oscilloscope. The contents of the display memory may then be displayed on the display. Thus, the characteristic values and the output values are transformed into a graphical representation that can easily be grasped by the user.

For example, said output value comprises a peak-to-peak value of said untriggered values in said predefined interval and a mean value of said untriggered values in said predefined interval. Said graphical representation having a vertical bar with at least one highlighted section, said highlighted section having a vertical height corresponding to said peak-to-peak value and having a vertical position corresponding to said mean value. The dimensions, the position, and/or the scaling of the graphical representation may correspond to the current representation of data in the display memory or the representation desired by and set by the user. This way, the position and spread of the signal incoming at the measurement channel with respect to the trigger condition can easily be perceived by the user.

For activating the support for setting the trigger condition, said oscilloscope has at least a first operating mode, said digital voltmeter being activated for at least one of determining of said output value, storing of said output value, and determining a graphical representation in said first operating mode.

For example, a predefined number of the most recent output values is kept in said output memory allowing that information about the change of the incoming signal can be analyzed.

A predefined number of the most recent output values may be kept in said output memory, and said graphical representation may include a representation for each output value present in said output memory in order to inform the user about the change in the incoming signal.

In a variation, a predefined number of the most recent output values are kept in said output memory, and said graphical representation comprises a highlighted section for each output value present in said output memory. If several sections overlap, the highlighting may become more intense. This way, an intuitive representation of the information about the incoming signal and the characteristic value is possible.

In another aspect of the disclosure, said output value is determined without at least one of altering said digital measurement input signal values stored in said acquisition memory and altering further processing of said digital measurement input signal values stored in said acquisition. This may include that a graphical representation of digitized measurement input signal values stored in the display memory or the values themselves in the display memory are not altered. Thus, providing information about the current state of the incoming signal to the user is independent from prior measurements.

This also means that the data acquired after the last occurrence of the trigger condition is permanently displayed and not discarded automatically.

In an embodiment of the disclosure, at least one of determining of said output value, storing of said output value and determining a graphical representation is performed if said triggering unit is activated and said trigger condition is not met for a predetermined duration. The triggering unit may be activated during the first operation mode of the oscilloscope. The duration may be between 0.5 s to 1.5 s and is, for example, equal to 1 s. This way, the user is not disturbed by the information about the current position and state of the incoming signal if the trigger condition is met.

In a variation, at least one of determining said output value, storing of said output value, and determining a graphical representation is performed if a trigger time-out has not been set, in order to support the user selecting a suitable trigger condition. In other words, at least one of determining of said output value, storing of said output value and determining a graphical representation is performed in norm-trigger mode.

For example, at least one of determining of said output value, storing of said output value, and determining a graphical representation is not performed if said trigger condition is met in order to avoid unnecessary calculations and waste of resources.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 shows schematically an oscilloscope 10 having a measurement channel 12.

Figure 1:
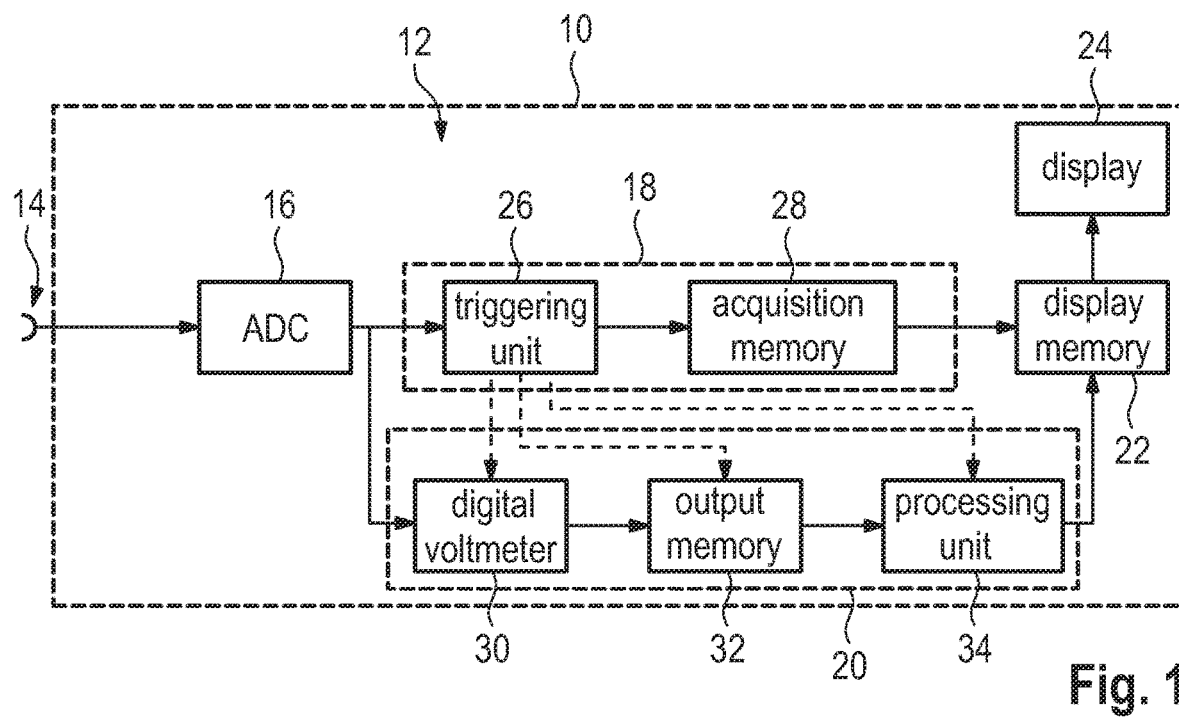
FIG. 1 shows a schematic block diagram of a measurement channel of an oscilloscope according to an aspect of the disclosure.

The measurement channel 12 comprises a measurement channel input 14 that may be connected to a device under test (not shown) for measuring a signal.

The oscilloscope 10 may have more than one measurement channel 12 but only one measurement channel 12 is illustrated for sake of simplicity.

The measurement channel 12 comprises an analog-to-digital converter 16 (ADC), a first processing path 18, a second processing path 20, a display memory 22, and a display 24.

The analog-to-digital converter 16 is connected to the first processing path 18 and the second processing path 20.

The first processing path 18 and the second processing path 20 run parallel to each other and are both connected to the display memory 22.

The display memory 22 is in turn connected to the display 24.

The first processing path 18 includes a triggering unit 26 and an acquisition memory 28.

The triggering unit 26 is connected to the analog-to-digital converter 16 and may be a field programmable gate array (FPGA).

The acquisition memory 28 is on one hand connected to the triggering unit 26 and may receive data from the triggering unit 26.

The acquisition memory 28 is on the other hand connected to the display memory 22, usually via a data analysis unit that is not shown for the sake of simplicity.

The second processing path 20 has a digital voltmeter 30, an output memory 32, and a processing unit 34.

The digital voltmeter 30 is connected on one hand to the analog-to-digital converter 16 and on the other hand to the output memory 32.

The output memory 32 is then connected to the processing unit 34, which is connected to the display memory 22.

The display memory 22, the triggering unit 26, the acquisition memory 28, the digital voltmeter 30, the output memory 32, and the processing unit 34 may altogether, individually or in a combination be part of a computation- and/or control unit of the oscilloscope 10 and integrated into one another.

For measurements, the measurement channel input 14 is connected to the device under test, so that a signal to be measured is incoming at the measurement channel 12. This signal is also called incoming signal in this disclosure.

The incoming signal is transmitted to the analog-to-digital converter 16 that creates a stream of digitized measurement input signal values.

In the shown embodiment, the digitized measurement input signal values are then transmitted on the one hand to the triggering unit 26 and on the other hand to the digital voltmeter 30.

Because the digitized measurement input signal values that are fed to the digital voltmeter 30 have not passed through the triggering unit 26 and are thus not subject to the trigger condition, these values are also called "untriggered values".

For analyzing the incoming signal, the user of the oscilloscope 10 may activate a first operating mode of the oscilloscope 10, in which the triggering unit 26 and the digital voltmeter 30 are active.

The user sets a trigger condition of the triggering unit 26 to a desired value or selects a certain operation mode.

The triggering unit 26 analyses the digitized measurement input signal values received from the analog-to-digital converter 16. The triggering unit 26 determines whether these values meet the trigger condition or not.

The trigger condition may be a threshold value and the trigger condition is met if one of the digitized measurement input signal values exceeds this threshold.

If the trigger condition is met, a predefined number of digitized measurement input signal values are fed from the triggering unit 26 to the acquisition memory 28 and stored in the acquisition memory 28 for further analysis.

The values in the acquisition memory 28 can then be analyzed using the analyzing unit, and a main graphical representation 35 of these values is created by the analyzing unit and fed to the display memory 22. The main graphical representation 35 is then rendered on the display 24, as can be seen on the left hand side of FIG. 2.

Thus, the first processing path 18 creates the main graphical representation 35 of the incoming signal using a trigger condition in a per se known manner.

Figure 3:
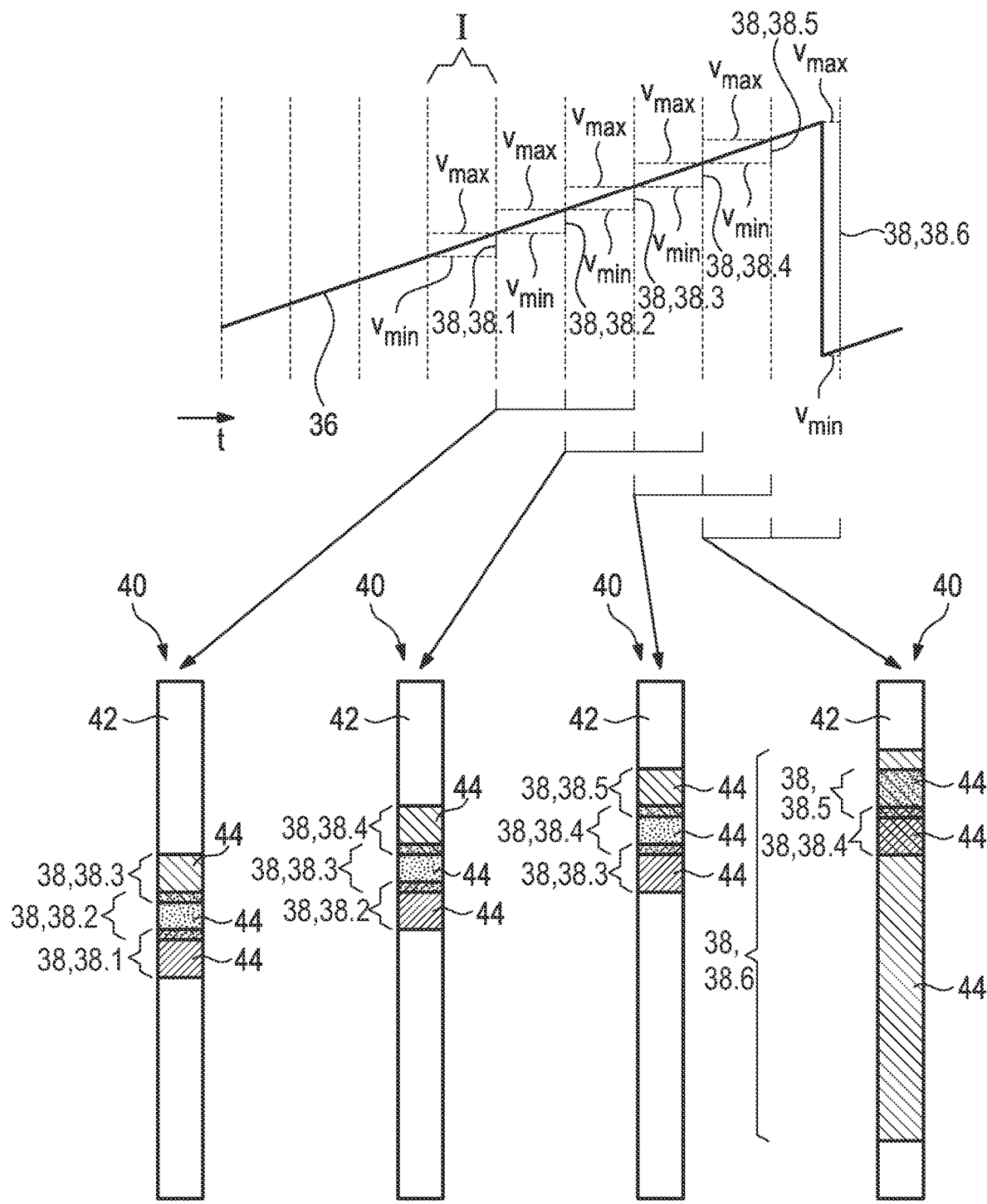
FIG. 3 shows schematically the creation of a graphical representation from digitized measurement input signal values.

In the second processing path 20, the digitized measurement input signal values or untriggered values 36 are received by the digital voltmeter 30; please also refer to FIG. 3.

The digital voltmeter 30 determines at least one characteristic value 38 of said untriggered values for a predetermined interval I. The characteristic value 38 may be the peak-to-peak value, the root mean square and/or the mean value of said untriggered values within the interval I.

The interval I may have the length between 50 ms and 150 ms and has, for example, a length of 100 ms.

Based on the characteristic value 38, the digital voltmeter 30 determines an output value and stores the output value in the output memory 32.

The output value may be a vector or list of one or more characteristic values 38.

The processing unit 34 accesses the output value and/or the characteristic value 38 stored in the output memory 32 and creates an auxiliary graphical representation 40 based on the output value, possibly in combination with the characteristic value 38. The processing unit 34 stores the auxiliary graphical representation 40 in the display memory 22.

Figure 2:
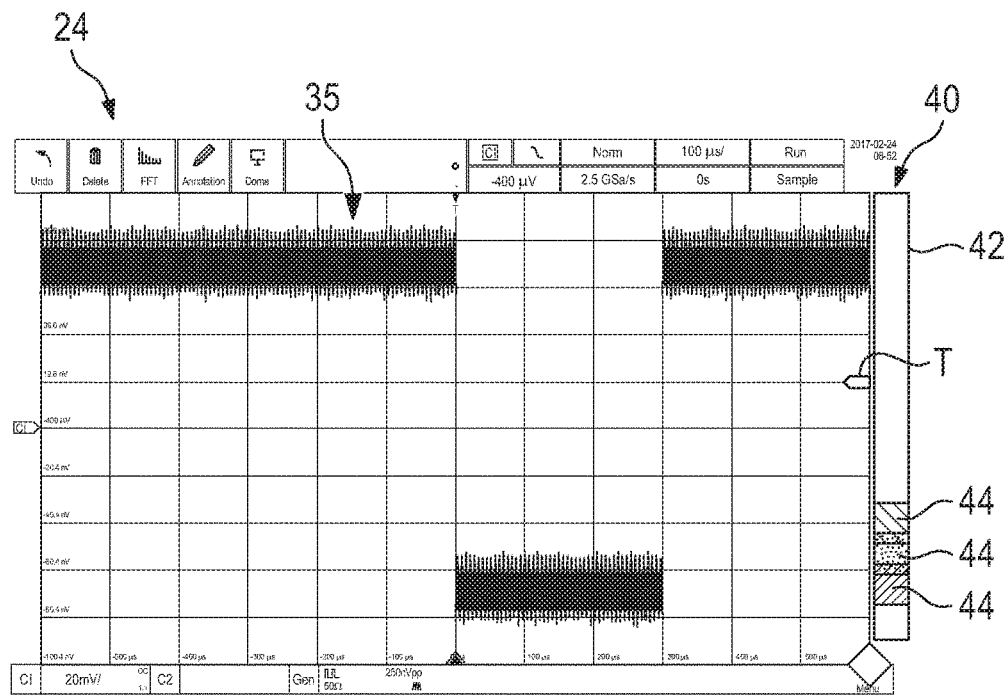
FIG. 2 shows a display of the oscilloscope according to an aspect of the disclosure during execution of the method according to an aspect of the disclosure.

The auxiliary graphical representation 40 in the display memory 22 is then rendered on the display 24, as can be seen on the right hand side of FIG. 2.

In the shown embodiment, the auxiliary graphical representation 40 comprises a vertical bar 42 with highlighted sections 44 extending on the same scale as the main graphical representation 35 of the triggered digitized measurement input signal values.

The main graphical representation 35 and the auxiliary graphical representation 40 have the same scaling.

The current trigger condition T is also displayed on the display 24 at the corresponding height.

This way, the user is able to quickly identify the range the incoming signal is currently located in by looking at the auxiliary graphical representation 40.

FIG. 3 shows the processing that is done in the second processing path 20.

The upper part of FIG. 3 shows a graph of the untriggered values 36 over time that are received by the digital voltmeter 30. The vertical dashed lines represent the intervals I that are used to determine the characteristic value 38.

For each interval I, the digital voltmeter 30 calculates the minimum value $v_{min}$ and the maximum value $v_{max}$ of the untriggered values 36 in the respective interval I.

The digital voltmeter 30 then subtracts the minimum value $v_{min}$ from the maximum value $v_{max}$ and receives a differential value as a part of the characteristic value 38.

The differential value is therefore the difference between said maximum value $v_{max}$ and the minimum value $v_{min}$ within the interval I and corresponds to the peak-to-peak value.

Further, the digital voltmeter 30 may determine the mean value of the untriggered values 36 in the respective interval I as another part of the characteristic value 38.

In the example of FIG. 3, the digital voltmeter 30 determines six differential values and means values over time, namely characteristic values 38.1, 38.2, 38.3, 38.4, 38.5, and 38.6. For each of these characteristic values 38.1-38.6, the digital voltmeter 30 creates an output value being, for example, the peak-to-peak value and the mean value.

After each interval I, the digital voltmeter 30 determines and stores the output value in the output memory 32.

However, only a predefined number of output values can be stored in the output memory, so that only a predefined number of the most recent output values are kept in the output memory 32. In the shown embodiment, the predefined number is three.

Thus, each time the digital voltmeter 30 stores the output values corresponding to the characteristic values 38.4-38.6, the oldest output value in the output memory 32 is overwritten. This process is illustrated in the middle part of FIG. 3.

The output values are then accessed or transmitted to the processing unit 34 that creates the auxiliary graphical representation 40, shown in the bottom part of FIG. 3.

For each of the output values present in the output memory 32, the processing unit 34 creates a highlighted section 44 on the vertical bar 42.

The highlighted section 44 has a vertical height, i.e. a length in the vertical direction, corresponding to the peak-to-peak value, i.e. to a part of the characteristic value 38.

The vertical position, i.e. distance between the lower end of the vertical bar 42 of the middle of the highlighted section 44, of each of the highlighted sections 44 corresponds to the mean value of the untriggered values 36 in the interval I, thus another part of the characteristic value 38.

For each output value in the output memory a highlighted section 44 is created. When two or more highlighted sections 44 overlap, the highlighting is intensified. For example, if the highlighting is done with a single color, the saturation of that color is increased with each highlighted section 44 overlapping a specific point on the vertical bar 42.

The creation of the auxiliary graphical representation 40 of the output value may be independent from the first processing path 18, especially from the acquisition memory 28 and the data stored therein. Thus, creating the main graphical representation 35 of the signal input at the measurement channel 12 and creating the auxiliary graphical representation 40 of the output values are distinct processes. These processes do not influence each other with regard to the data generated.

In particular, the characteristic value 38 and the output value are not determined on the basis of the data stored in the acquisition memory 28.

In another embodiment, it is possible that the auxiliary graphical representation 40 is not shown on the display if the trigger condition is met.

In this case, neither an output value nor a characteristic value 38 may be determined or stored in the output memory 32. Further, no graphical representation is created in order to save resources of the oscilloscope and not to disturb the user.

Alternatively, the output value or the characteristic value 38 is determined and stored in the output memory 32, but not forwarded to the display memory 22 if the trigger condition is met as the graphical representation 35 of the signal input is only displayed at the display 24.

However, if the signal input at the measurement channel 12 falls below the trigger condition permanently or for a longer duration, the trigger condition is not met anymore. Then, the second processing path 20 is activated as illustrated by the dashed arrows in FIG. 1. This is done, for example, if a trigger time-out has not been set, i.e. if the first processing path 18 works in a norm trigger mode.

The duration until the second processing path 20 is activated may be between 0.5 s and 1.5 s, for example 1 s. The duration may depend on the trigger condition set.

The digital voltmeter 30 then determines the characteristic value 38 and the output value and stores these values in the output memory 32. Further, the processing unit 34 creates graphical representations 40 based on the data of the output memory 32, as explained above.

In the first processing path 18, no new data is stored in the acquisition memory 28. Thus, the main graphical representation 35 of the incoming signal at the measurement channel 12 remains the same.

In this case, the main graphical representation 35 of the last data that met the trigger condition and the auxiliary graphical representation 40 are displayed. This situation corresponds to FIG. 2 as well.

If the user wishes that the current incoming signal is displayed, he has to adjust the trigger condition. Due to the auxiliary graphical representation 40, the user can easily identify that the trigger condition T is well above the current location of the incoming signal. He can then, if he wishes, adjust the trigger condition T manually and has therefore full control over the measurement at any time.

In further embodiments, it is also possible that the digital voltmeter 30 receives the untriggered values 36 from the triggering unit 26, if the trigger condition has not been met for the predetermined duration. These values are also considered untriggered values 36 because they have not been stored in the acquisition memory 28.

Some of the operations described above may be implemented in software and other operations may be implemented in hardware. One or more of the operations, processes, or methods described herein may be performed by an apparatus, device, or system similar to those as described herein and with reference to the illustrated figures. The computing devices described above may include any collection of devices or circuitry that individually or jointly execute a set (or multiple sets) of instructions to perform any one or more of the operations discussed above. Computing devices may be part of an integrated control system or system manager, or may be provided as a portable electronic device configured to interface with a networked system either locally or remotely via wireless transmission.

"Computer-readable storage medium" (or alternatively, "machine-readable storage medium") may include any type of memory, as well as new technologies that may arise in the future, as long as they may be capable of storing digital information in the nature of a computer program or other data, at least temporarily, in such a manner that the stored information may be "read" by an appropriate processing device. The computer-readable medium may store computer instructions that are executed by a processing device. The term "computer-readable" may not be limited to the historical usage of "computer" to imply a complete mainframe, mini-computer, desktop, wireless device, or even a laptop computer. Rather, "computer-readable" may comprise storage medium that may be readable by a processor, processing device, or any computing system. Such media may be any available media that may be locally and/or remotely accessible by a computer or processor, and may include volatile and non-volatile media, and removable and non-removable media.

Examples of systems, apparatus, computer-readable storage media, and methods are provided solely to add context and aid in the understanding of the disclosed implementations. It will thus be apparent to one skilled in the art that the disclosed implementations may be practiced without some or all of the specific details provided. In other instances, certain process or methods also referred to herein as "blocks," have not been described in detail in order to avoid unnecessarily obscuring the disclosed implementations. Other implementations and applications also are possible, and as such, the following examples should not be taken as definitive or limiting either in scope or setting.

References have been made to accompanying drawings, which form a part of the description and in which are shown, by way of illustration, specific implementations. Although these disclosed implementations are described in sufficient detail to enable one skilled in the art to practice the implementations, it is to be understood that these examples are not limiting, such that other implementations may be used and changes may be made to the disclosed implementations without departing from their spirit and scope. For example, the blocks of the methods shown and described are not necessarily performed in the order indicated in some other implementations. Additionally, in other implementations, the disclosed methods may include more or fewer blocks than are described. As another example, some blocks described herein as separate blocks may be combined in some other implementations. Conversely, what may be described herein as a single block may be implemented in multiple blocks in some other implementations. Additionally, the conjunction "or" is intended herein in the inclusive sense where appropriate unless otherwise indicated; that is, the phrase "A, B or C" is intended to include the possibilities of "A," "B," "C," "A and B," "B and C," "A and C" and "A, B and C."

Having described and illustrated the principles of a preferred embodiment, it should be apparent that the embodiments may be modified in arrangement and detail without departing from such principles. Claim is made to all modifications and variation coming within the spirit and scope of the following claims.

The invention claimed is:

1. An oscilloscope having at least one measurement channel, said measurement channel comprising:
   an analog-to-digital converter for converting an analog measurement input signal to digitized measurement input signal values,
   a triggering unit having a trigger condition comprising a threshold,
   an acquisition memory for storing said digitized measurement input signal values if said trigger condition is met, and
   a digital voltmeter connected between said analog-to-digital converter and an output memory, said digital voltmeter for receiving said digitized measurement input signal values as untriggered values, the untriggered values representing said digitized measurement input signal values that have not been stored in said acquisition memory,
      determining a characteristic value of said untriggered values in a predefined interval,
      determining one or more output values based on said characteristic value, and
      storing said output values in an output memory of said oscilloscope,
   a processing unit for determining a graphical representation of at least one of said output values stored in said output memory and for storing said graphical representation in a display memory of said oscilloscope.

2. The oscilloscope according to claim 1, wherein said characteristic value is at least one of the peak-to-peak value, the root mean square, and the mean value of said untriggered values within said interval.

3. The oscilloscope according to claim 1, wherein the length of said interval lies between 50 ms and 150 ms.

4. The oscilloscope according to claim 1, wherein said digital voltmeter is adapted to determine said characteristic value by determining the minimum value and the maximum value of said untriggered values in said interval, determining a differential value as at least part of said characteristic value, said differential value being the difference between said maximum value and said minimum value.

5. The oscilloscope according to claim 1, wherein said output value comprises a peak-to-peak value of said untriggered values in said predefined interval and a mean value of said untriggered values in said predefined interval,
   said graphical representation having a vertical bar with at least one highlighted section, said highlighted section having a vertical height corresponding to said peak-to-peak value and having vertical position corresponding to said mean value.

6. The oscilloscope according to claim 1, wherein said oscilloscope has at least a first operating mode, said digital voltmeter being activated for at least one of determining of said output value, storing of said output value, and determining a graphical representation in said first operating mode.

7. A method for analyzing a measured signal using an oscilloscope with the following steps:
   a) converting said measured signal into digitized measurement input signal values by an analog-to-digital converter,
   b) determining if at least one of said digitized measurement input signal values meets a trigger condition by a triggering unit of said oscilloscope, wherein the trigger condition comprises a threshold,
   c) if said trigger condition is met, storing said digitized measurement input signal values in an acquisition memory,
   d) providing said digitized measurement input signal values to a digital voltmeter of said oscilloscope as untriggered values, the untriggered values representing said digitized measurement input signal values that have not been stored in said acquisition memory,
   e) determining at least one characteristic value of said untriggered values in a predefined interval,
   f) determining one or more output values based on said at least one characteristic value,
   g) storing said output values in an output memory of said oscilloscope, and
   h) determining, by a processing unit, a graphical representation of at least one of the output values stored in said output memory and storing said graphical representation in a display memory of said oscilloscope.

8. The method according to claim 7, wherein a predefined number of the most recent output values is kept in said output memory.

9. The method according to claim 7, wherein said characteristic value is at least one of a peak-to-peak value, root mean square, and mean value of said untriggered values within said interval.

10. The method according to claim 7, wherein the length of said interval lies between 50 ms and 150 ms.

11. The method according to claim 7, wherein said digital voltmeter determines said characteristic value by determining a minimum value and a maximum value of said untriggered values in said interval, determining a differential value as at least part of said characteristic value, said differential value being the difference between said maximum value and said minimum value.

12. The method according to claim 7, wherein a predefined number of the most recent output values are kept in said output memory, and said graphical representation includes representations for the output values present in said output memory.

13. The method according to claim 7, wherein said output values comprise a peak-to-peak value of said untriggered values in said predefined interval and a mean value of said untriggered values in said predefined interval, said graphical representation having a vertical bar with at least one highlighted section, said highlighted section having a vertical height corresponding to said peak-to-peak value and having a vertical position corresponding to said mean value.

14. The method according to claim 7, wherein a predefined number of the most recent output values are kept in said output memory, and said graphical representation comprises a highlighted section for each output value present in said output memory.

15. The method according to claim 7, wherein said output values are determined without at least one of altering said digitized measurement input signal values stored in said acquisition memory and altering further processing of said digitized measurement input signal values stored in said acquisition memory.

16. The method according to claim 7, wherein at least one of determining of said output values, storing of said output values and determining a graphical representation is performed if said triggering unit is activated and said trigger condition is not met for a predetermined duration.

17. The method according to claim 16, wherein at least one of determining of said output values, storing of said output values, and determining a graphical representation is performed if a trigger time-out has not been set.

18. The method according to claim 7, wherein at least one of determining of said output values, storing of said output values, and determining a graphical representation is not performed if said trigger condition is met.

* * * * *